United States Patent
Morton et al.

(10) Patent No.: US 9,748,726 B1
(45) Date of Patent: Aug. 29, 2017

(54) MULTIPLE-MICRORESONATOR BASED LASER

(71) Applicants: Paul A. Morton, West Friendship, MD (US); Jacob Khurgin, Pikesville, MD (US); Christopher D. Morton, West Friendship, MD (US)

(72) Inventors: Paul A. Morton, West Friendship, MD (US); Jacob Khurgin, Pikesville, MD (US); Christopher D. Morton, West Friendship, MD (US)

(73) Assignee: Morton Photonics, West Friendship, MD (US)

(*) Notice: Subject to any disclaimer, the term of this patent is extended or adjusted under 35 U.S.C. 154(b) by 0 days.

(21) Appl. No.: 15/372,935

(22) Filed: Dec. 8, 2016

Related U.S. Application Data

(63) Continuation-in-part of application No. 14/828,846, filed on Aug. 18, 2015, now Pat. No. 9,559,484.

(60) Provisional application No. 62/038,428, filed on Aug. 18, 2014.

(51) Int. Cl.
| | | |
|---|---|---|
| H01S 3/10 | (2006.01) | |
| H01S 3/081 | (2006.01) | |
| H01S 3/083 | (2006.01) | |
| H01S 5/10 | (2006.01) | |
| H01S 5/14 | (2006.01) | |
| H01S 5/02 | (2006.01) | |

(52) U.S. Cl.
CPC ............ *H01S 3/083* (2013.01); *H01S 5/1032* (2013.01); *H01S 5/142* (2013.01); *H01S 3/10053* (2013.01); *H01S 5/021* (2013.01)

(58) Field of Classification Search
CPC ........ H01S 3/083; H01S 5/142; H01S 5/1032; H01S 5/021; H01S 3/10053
See application file for complete search history.

(56) References Cited

U.S. PATENT DOCUMENTS

| | | | | |
|---|---|---|---|---|
| 2006/0198415 A1* | 9/2006 | Yamazaki | .......... | G02B 6/12007 372/94 |
| 2006/0222038 A1* | 10/2006 | Yamazaki | ............. | H01S 5/0612 372/94 |
| 2008/0025358 A1* | 1/2008 | Arahira | ............... | H01S 5/06256 372/38.02 |
| 2009/0059973 A1* | 3/2009 | Suzuki | .................... | H01S 5/142 372/20 |
| 2009/0244544 A1* | 10/2009 | Terrel | ................... | G01C 19/727 356/461 |

(Continued)

*Primary Examiner* — Yuanda Zhang
(74) *Attorney, Agent, or Firm* — Nadya Reingand

(57) ABSTRACT

This invention describes algorithmic and computational approaches to optimize the design and performance of microresonator based ultra-low noise lasers including a reflector or filter comprised of multiple (≥3) microresonator rings with different ring radii coupled together through bus waveguides. The enhanced reflector/filter design optimization provides more control over the key parameters, including the suppression ratio of unwanted modes over both a wide wavelength range (supporting wide wavelength tunability) and over the narrow range around the laser wavelength (improving laser singlemode and noise performance), while also enabling the design of specific reflector/filter bandwidth and effective length (delay), supporting the design of an ultra-low noise laser with specific operating performance parameters.

20 Claims, 13 Drawing Sheets

(56) References Cited

U.S. PATENT DOCUMENTS

| | | | |
|---|---|---|---|
| 2011/0013654 A1* | 1/2011 | Yamazaki | H01S 5/0687 372/29.02 |
| 2011/0019955 A1* | 1/2011 | Morton | G02F 1/011 385/1 |
| 2011/0038036 A1* | 2/2011 | Todt | H01S 5/0264 359/341.1 |
| 2011/0164299 A1* | 7/2011 | Morton | G02F 1/011 359/238 |
| 2012/0189025 A1* | 7/2012 | Zheng | H01S 5/1071 372/20 |
| 2015/0016767 A1* | 1/2015 | Akiyama | H01S 5/142 385/3 |

* cited by examiner

MULTIPLE-MICRORESONATOR BASED LASER

CROSS-REFERENCE TO RELATED APPLICATIONS

Continuation-in-part of U.S. patent application Ser. No. 14/828,846 filed on Aug. 18, 2015, claiming priority to U.S. provisional patent application No. 62/038,428 filed Aug. 18, 2014.

STATEMENT REGARDING FEDERAL SPONSORED RESEARCH AND DEVELOPMENT

This invention was made with U.S. Government support under Contract W911NF-16-C-0072 under a DARPA MTO STTR Project, and the U.S. Government has certain rights in the invention.

FIELD OF INVENTION

This invention relates to high performance fiber optic and free-space communications systems, RF photonics systems, and optical sensing systems.

BACKGROUND

The device concepts are based on the use of microresonator rings as the filter elements within a laser cavity, either as part of a reflector in a linear laser cavity, or part of the filter within a ring laser cavity. These laser cavity designs have been used previously with optical microresonator rings forming the filters/reflectors; in these previous cases the devices used a maximum of two microresonators with different ring radii, placed in series to provide the filter function, this filter function having limitations leading to reduced laser performance; relatively large linewidth, low output power, poor relative intensity noise (RIN), and limited mode selectivity.

Previous tunable laser designs based on ring reflectors in a linear cavity, using a III-V monolithic semiconductor platform such as "Full C-Band Tuning Operation of Semiconductor Double-Ring Resonator-Coupled Laser With Low Tuning Current" by T. Segawa et al, IEEE PHOTONICS TECHNOLOGY LETTERS, 19, pages 1322-1324, 2007, and "Microring-Resonator-Based Widely Tunable Lasers", by S. Matsuo et al, IEEE JOURNAL of SELECTED TOPICS in QUANTUM ELECTRONICS, 15, pages 545 to 554, 2009, or using a silicon photonics platform such as "Compact, lower-power-consumption wavelength tunable laser fabricated with silicon photonic-wire waveguide micro-ring resonators", by T. Chu T et al, OPTICS EXPRESS, 17, pages 14063 to 14068, 2009, and "25 kHz Narrow Spectral Bandwidth of a Wavelength Tunable Diode Laser with a Short Waveguide-Based External Cavity", by R. M. Oldenbeuving et al, LASER PHYSICS LETTERS, 10, 015804, 2013, utilized a reflector incorporating two rings with slightly different radius, and therefore different Free Spectral Range (FSR). These two rings are tuned using a Vernier approach; one resonance from each ring is aligned to provide a small pass band through the combined filter, all other wavelengths within the gain bandwidth of the gain element being blocked. A ring-cavity laser, also using two rings and the Vernier effect for tuning, described in "Widely tunable vernier ring laser on hybrid silicon", by J. C. Kulme et al, OPTICS EXPRESS, 21, pages 19718 to 19722, 2013, was fabricated using heterogeneous integration on a silicon photonics platform. A schematic and picture of the monolithically integrated III-V laser by Matsuo is shown in FIG. 1, with the version more recently developed using silicon nitride ($Si_3N_4$) waveguides on a silicon on insulator (SOI) substrate and an external gain chip, by Oldenbeuving, shown in FIG. 2(a); the power reflectivity of the reflector in this device is shown in FIG. 2(b).

The III-V based device in FIG. 1 used the facets on both sides of the laser for reflectors, with the two rings filtering the signal passing though them in a double pass scheme. The device in FIG. 2 (a) had an external gain chip, and achieved reasonable results; C-Band tunability, <25 kHz linewidth, and 50 dB Side Mode Suppression Ratio (SMSR), however, the output power of the laser was very low, only 1 mW. The 50 dB SMSR, while typical for this and other reported devices, and for distributed feedback (DFB) lasers, indicates too high a value for the RIN of the device for use in RF photonics and other high performance applications, as the RIN of a laser is directly proportional to its SMSR value. An SMSR of ~70 dB can be seen in lasers with very low RIN. The designed reflector response for the device in FIG. 2(a) is shown in FIG. 2(b); this reflector has insufficient suppression of reflections from the non-lasing cavity modes to obtain ultra-low noise operation.

One group of previous works utilized two small waveguide based rings with different FSR, e.g. III-V or silicon microresonators, to provide the correct mode selectivity for singlemode lasing; the smaller the rings the higher the FSR, and the higher overall mode selectivity. Tunable lasers that covered the C-Band (1535-1565 nm) were fabricated, however, the relatively high optical loss of silicon or III-V waveguides, especially when used in small microresonators (radii of ~10 microns), e.g. 2 to 4 dB/cm for silicon, gave rise to lossy filters/reflectors, and therefore short effective cavity lengths—which do not provide the required narrow linewidth operation and high power needed for advanced systems. The small microresonators are also operated with high Q, providing very high power density within the rings—leading to self-heating (and changing the ring resonance frequency) and also nonlinear effects within the rings. This limits the possible power levels at which these devices can operate.

A lower loss waveguide/microresonator material, $Si_3N_4$ was used in prior art, where the dual ring microresonator based reflector was coupled to a semiconductor gain chip to form the external cavity laser (ECL) through hybrid integration. Reasonable results were found, but again, by using two rings and the Vernier effect in the reflector, using low but not ultra-low loss waveguides/microresonators, devices had limited mode selectivity, had low output power and relatively large linewidth.

There is a need for an increase in the effective cavity length of laser devices, while at the same time keeping optical losses low and mode selectivity high over a wide wavelength range, in order to overcome current limitations in laser devices which do not provide sufficiently narrow linewidth operation while also providing high output power and low RIN. There is a need for lasers with this high performance that can operate at a specific wavelength, or be able to be broadly tunable over a wide wavelength range.

SUMMARY

This invention is a novel concept for creating a low noise and high power tunable or fixed wavelength laser. The concept is applicable to both an integrated laser (monolithic or heterogeneously integrated), or a hybrid integrated version using a filter/reflector and separate gain chip. Low noise includes narrow linewidth operation, e.g. 10 kHz down to 10 Hz, to support high performance optical communication systems and fiber sensing systems, and also low RIN operation, e.g. ←155 dB/Hz, again, as required for high performance optical systems. High power is required for use in high performance systems without the need for optical amplification, or for limited booster amplification, with power levels from e.g. 20 mW up to 200 mW being required. Operating wavelengths can include a very wide range, based only upon the availability of semiconductor (or other) gain elements and optical waveguides/filters/reflectors with very low loss, ranging from ultraviolet (UV) e.g. 250 nm out to many microns, e.g. >10 microns.

The laser of the present invention has a cavity with at least three rings interconnected via buses; all rings have different sets of resonant frequencies; and one resonant frequency is common for all three rings.

DETAILED DESCRIPTION OF THE PREFERRED EMBODIMENT

The concept proposed in this patent application takes advantage of ultra-low loss optical waveguides and microresonator rings, e.g. by utilizing large radii (large circumference) rings fabricated with ultra-low loss $Si_3N_4$ or other materials. The total loss of a microresonator (in dB/cm) varies with radius, by using different waveguide designs optimized for each radius. A straight waveguide can provide the lowest loss, the design optimized for very low optical confinement, however, these waveguides have significant losses when a bend or a ring is made of the waveguide. Different waveguide materials and designs have losses that vary versus ring radius, and so the optimum waveguide design and ring radius depends on the required waveguide loss—examples of low loss $Si_3N_4$ waveguide designs and losses were previously described.

By moving to lower loss rings, longer effective laser cavity lengths can be obtained, providing very low linewidth laser operation. Longer cavity lengths require lower loss (per cm) so that the reflector peak reflectivity is still high, and so that it does not absorb significant light and self-heat. Larger rings have a lower power density for the same filter bandwidth, and therefore limit or eliminate nonlinear effects. However, as the radii of the rings increase, it becomes more difficult and eventually impossible to provide mode selectivity for singlemode operation with only two microresonators of different FSR using the Vernier effect. Previous attempts to make microresonator based lasers have therefore focused on using smaller radii to increase mode selectivity, trading device performance. In the approach of the current invention, large ring radii are used, in order to provide very low linewidth operation with high output power, with the mode selectivity issue being solved by adding one or more additional ring with different ring radii to the filter/reflector—expanding on the two ring Vernier effect to a 3 ring, 4 ring or higher number of rings based filter.

Figure 3:
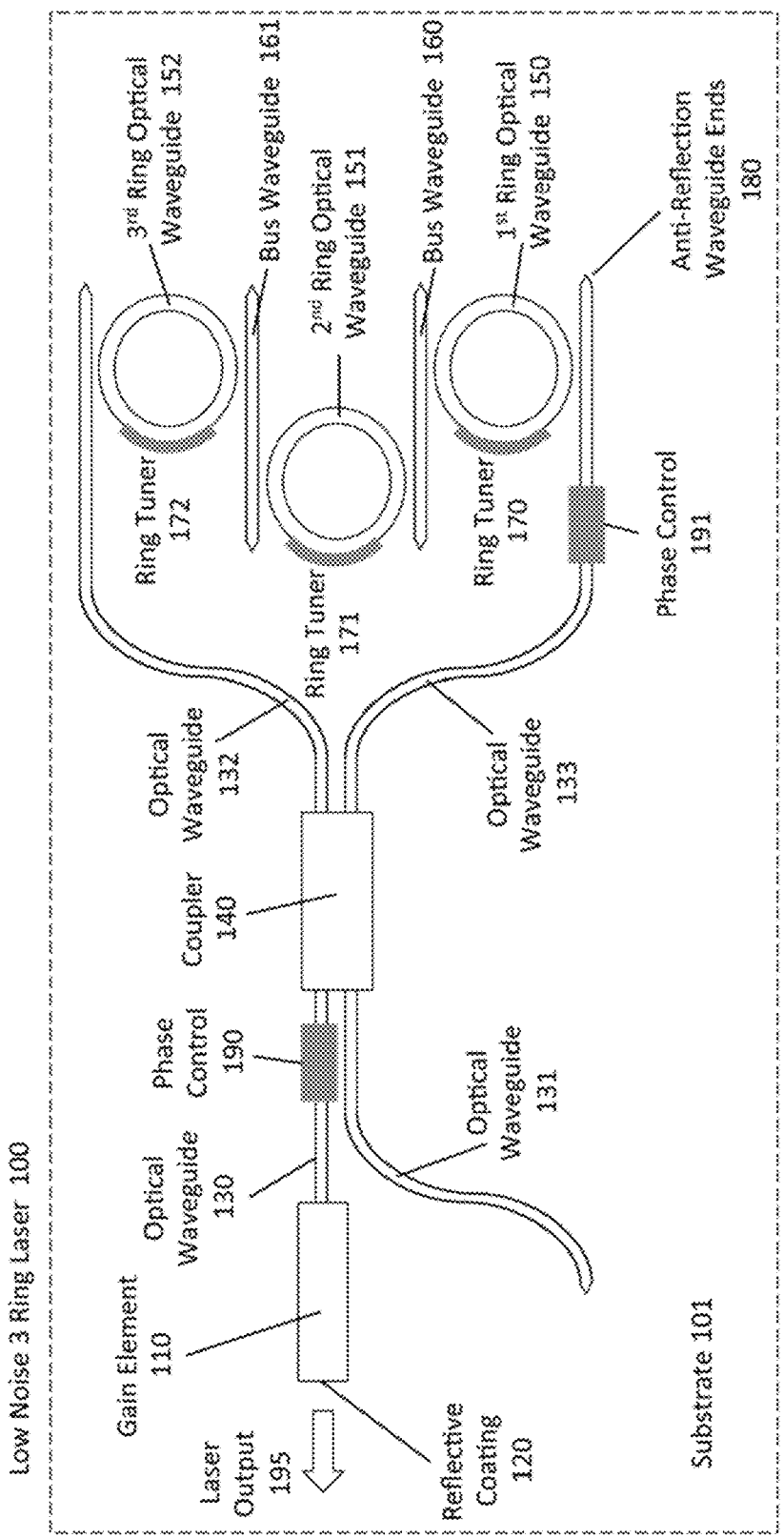
FIG. 3 Schematic of the 3 ring linear cavity laser design

In a linear cavity laser design, modeling at Morton Photonics showed that the use of 3 rings made with low loss (e.g. 0.2 dB/cm) $Si_3N_4$ waveguides, with 3 different and appropriately large radii (as required to achieve this low loss in these microresonators), significantly improves the selectivity of a single mode in the laser cavity, compared to a two microresonator design. A schematic of one embodiment of a 3 microresonator based low noise laser source 100 is shown in FIG. 3, integrated on substrate 101 to provide high phase stability of the optical components making up the laser, or in some cases integrating the reflector on a substrate for high phase stability, however, utilizing a separate gain chip. High phase stability within a laser cavity, e.g. <π/100 variation in phase over time, is required to ensure the laser stays in the same stable operating state, with singlemode operation and ultra-narrow linewidth throughout its operating lifetime. An optical signal 195 at a single wavelength is created through the combination of the gain element 110 and the mode selection achieved in the laser cavity. The laser cavity is comprised of a broadband reflective coating 120 at one end of the gain element that is chosen to be less than 100% reflective in order to provide the laser output signal 195, plus a Sagnac Loop reflector that creates the other end of the linear laser cavity, the Sagnac loop reflector being comprised of 3 ring optical waveguides (150, 151 and 152) with different ring radii (and therefore different FSR) interconnected with bus waveguides 160 and 161—the loop reflector providing a long effective cavity length plus the required mode selectivity. The gain element 110 is connected to the optical waveguide of the laser cavity 130 either directly for a monolithic (e.g. silicon photonics based) device, or through hybrid integration (e.g. with a lens) for a hybrid integrated laser. The Sagnac loop comprises a coupler 140, either a 2×2 directional coupler as shown in FIG. 3, or alternative coupler designs. In the preferred embodiment, a 50%/50% coupler is used to split the optical power coming from the gain element into the two optical waveguides (132 and 133) leaving the coupler 140, which pass through a phase control element 191 and the 3 ring optical waveguides 150, 151 and 152, before being re-combined at the coupler to complete the Sagnac loop and provide a wavelength selective reflector for the laser cavity with all of the energy reflected back to the gain element. If a different splitting ratio is achieved, either by design or by utilizing a tunable coupler for 140, an output can be taken from the $4^{th}$ waveguide of the coupler 140, i.e. the optical waveguide 131. Anti-reflection waveguide ends 180 (e.g. waveguides tapered down to a zero width over a long length) are added to the ends of all unused optical waveguides to avoid optical reflections at those waveguide ends from degrading the reflection response of the Sagnac loop based wavelength selective optical reflector. The resonance frequencies of each of the 3 ring optical waveguides 150, 151, 152, can be independently tuned using ring tuners 170, 171 and 172 respectively. The phase control element 190 controls the laser cavity phase in order to control the exact wavelength of the lasing mode relative to the reflector peak wavelength. The Sagnac loop reflector phase control 191, together with the resonance frequency ring tuners of the 3 rings 170, 171, and 172 are used to control the peak reflection wavelength of the Sagnac loop based reflector. The wavelength of the laser is chosen by aligning all of the ring optical wavelengths near the desired optical wavelength, then setting the reflector phase and cavity phase to place the optical cavity mode at the desired wavelength relative to the reflector peaks; laser linewidth and RIN depend on the exact tuning between the reflector peak and the laser mode wavelength, e.g. lower linewidth being achieved by moving the lasing mode to the long wavelength side of the reflection peak.

Figure 1:
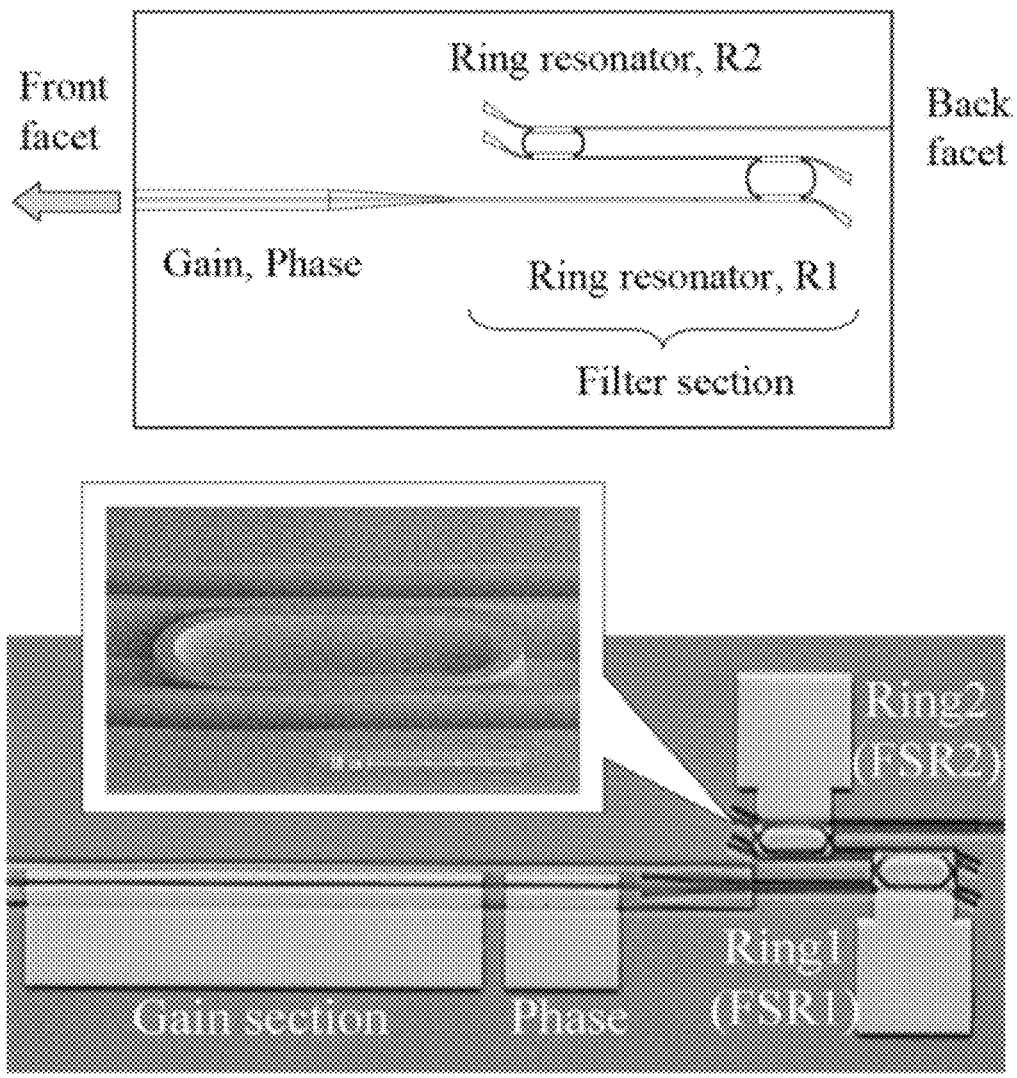
FIG. 1 Related art by Matsuo showing the laser structure design fabricated monolithically of III-V semiconductors which include two microresonators (R1 and R2) with different ring radii, using the vernier approach to provide mode selectivity.
Figure 2:
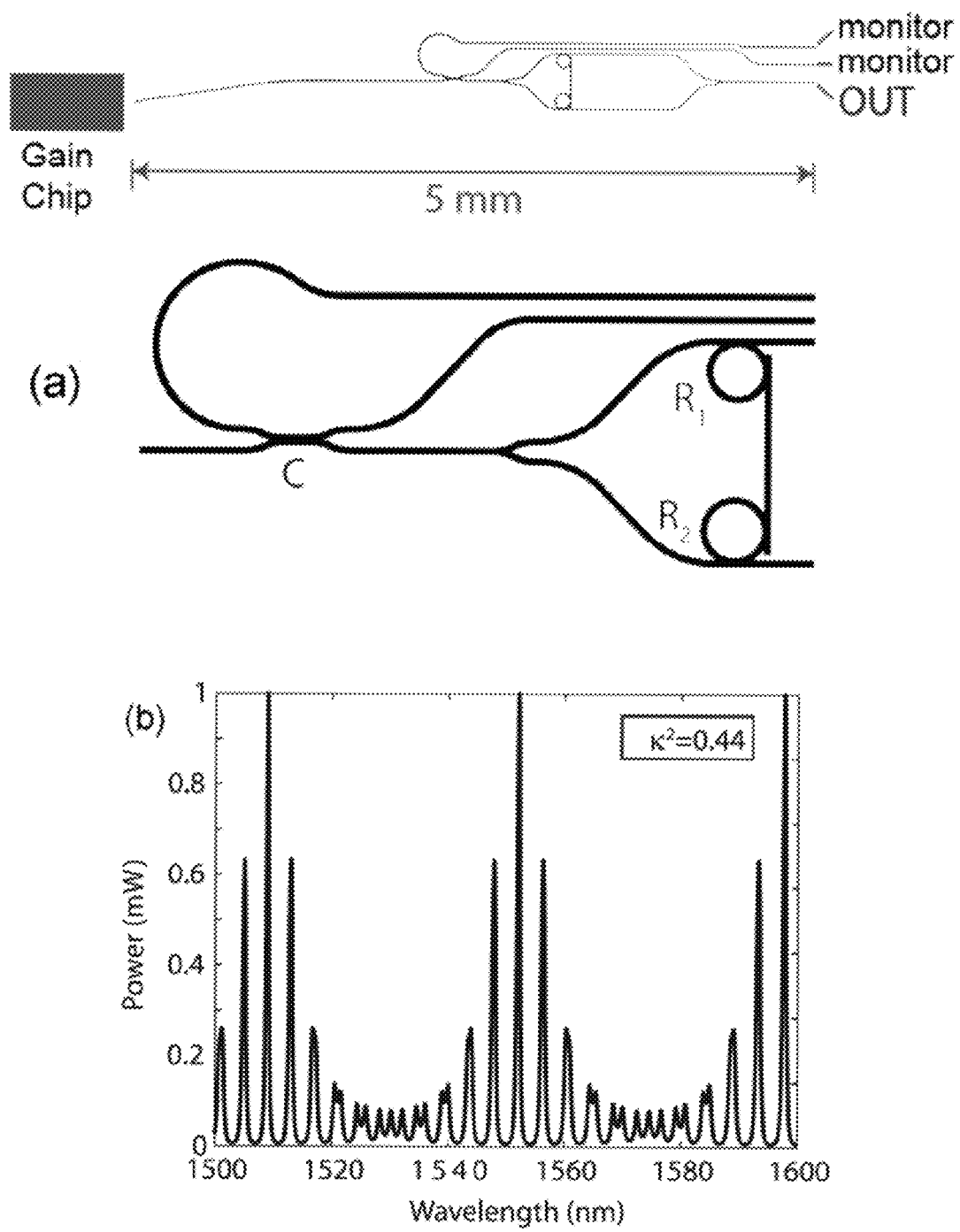
FIG. 2 Related art by Oldenbeuving, showing (a) the laser structure design—both the complete device and a zoom-in view of the reflector structure, which include two microresonators with different ring radii, and (b) the calculated reflection spectrum of the 2 microresonator design—showing an FSR of 44 nm, a secondary mode reflection power of 0.63 (for a suppression of the $2^{nd}$ modes of 2 dB), and a peak reflection bandwidth of 0.51 nm (64 GHz).
Figure 4:
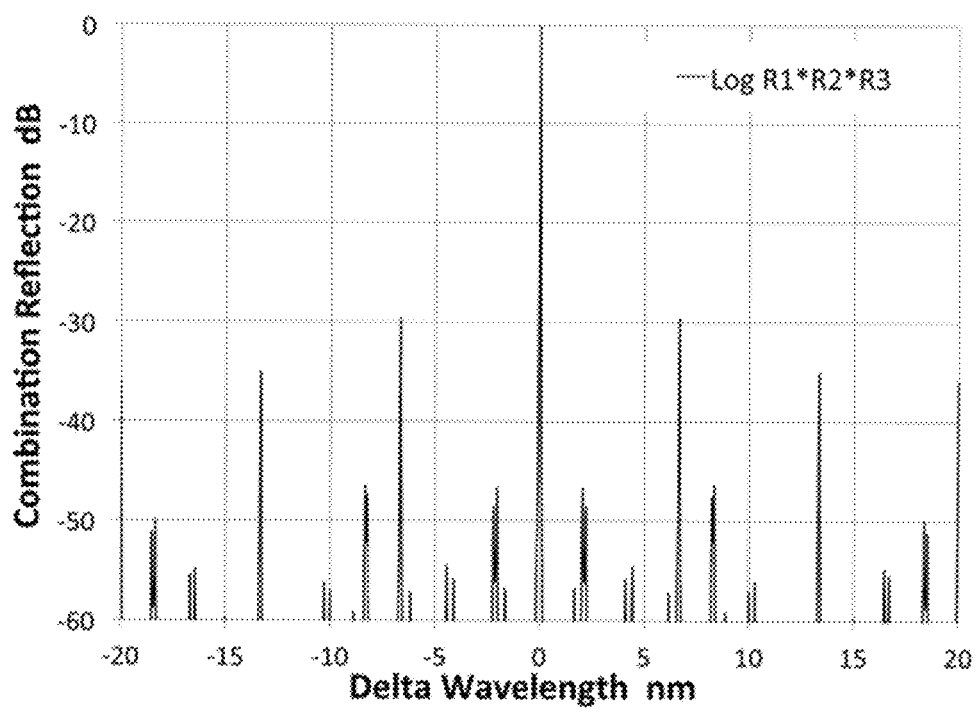
FIG. 4 Calculated power reflection spectrum for a 3 ring laser reflector using low loss $Si_3N_4$ waveguides and ring radii of 100, 108 and 133 microns.

Using larger ring radii also reduces the required Q factor of a reflector/filter design, and therefore increases the high power capability of the design. As an example, FIG. 4 shows the simulated power reflectivity of a reflector made from the combination of 3 microresonators, using ring radii of 100, 108 and 133 microns; this 3 ring design provides significantly more suppression of sidemodes, of almost 30 dB, compared to the two microresonator design shown in FIG. 2, which, using radii of 50 and 55 microns showed only 2 dB of mode suppression. In the reflection spectra in FIGS. 2 and 4, the microresonator resonances are aligned at the center wavelength, and then from differences in ring radii and therefore their FSR, the ring resonances are misaligned at other wavelengths. In FIG. 4, each microresonator is designed with a −3 dB bandwidth of 4 GHz, from the choice of coupling coefficient. The black lines show the combined response of the 3 microresonators (each of the responses multiplied together), plotted on a log scale. By comparison, the simulated reflector response shown in FIG. 2(b) showed sidemodes of the reflector at a reflectivity as high as 0.63 compared to the main reflection, or only 2 dB suppression.

Figure 5:
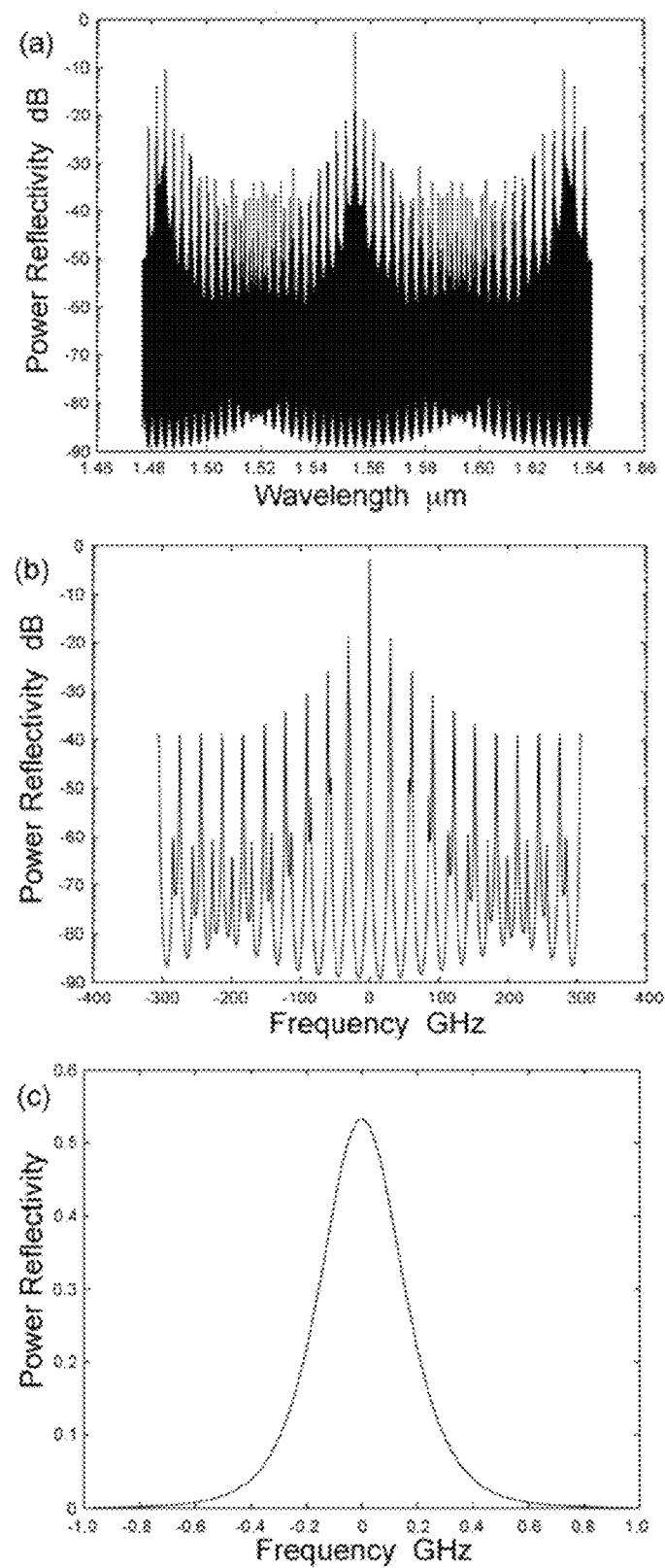
FIG. 5 Calculated power reflection spectra for a 3 ring laser reflector using ultra-low loss $Si_3N_4$ waveguides and ring radii of 1.0 mm, 1.00332 mm, and 1.07443 mm (Ring radii resonance frequencies chosen to align near 1550 nm); (a) shows the broad spectrum, (b) shows a closer look at the central and close in reflection peaks, and (c) shows a zoom in view of the central reflection peak.

Using this 3 microresonator approach with ultra-low loss $Si_3N_4$ waveguide designs that provide significantly lower loss, e.g. 10× lower loss, or 0.02 dB/cm, at significantly larger ring radii (≥1 mm), it is possible to obtain good mode suppression over a very wide range of wavelengths, while at the same time providing a very narrow filter bandwidth, a longer effective cavity length; and therefore much lower laser linewidth, while keeping the reflector loss low enough to support high power operation. An example of the combination reflection spectrum of a reflector using 3 ring radii close to 1 mm radius (1 mm, 1.00332 mm and 1.07443 mm) is shown in FIG. 5, with FIG. 5(a) showing the spectrum over a very wide wavelength range, FIG. 5(b) for a narrower wavelength/frequency range around the central reflection peak, and FIG. 5(c) showing a zoomed in region around the reflection peak. These spectra show a very wide wavelength range with good mode selectivity, i.e. >130 nm (which could support a very broadband; e.g. >50 nm, tunable laser), together with around 17 dB of suppression of the next largest reflection, a reflection full width at half maximum (FWHM) of only 0.4 GHz, and an effective length for the reflector of 67 mm—which would provide a Schawlow Townes linewidth for the laser of ~50 Hz at only 10 mW of output power.

Figure 6:
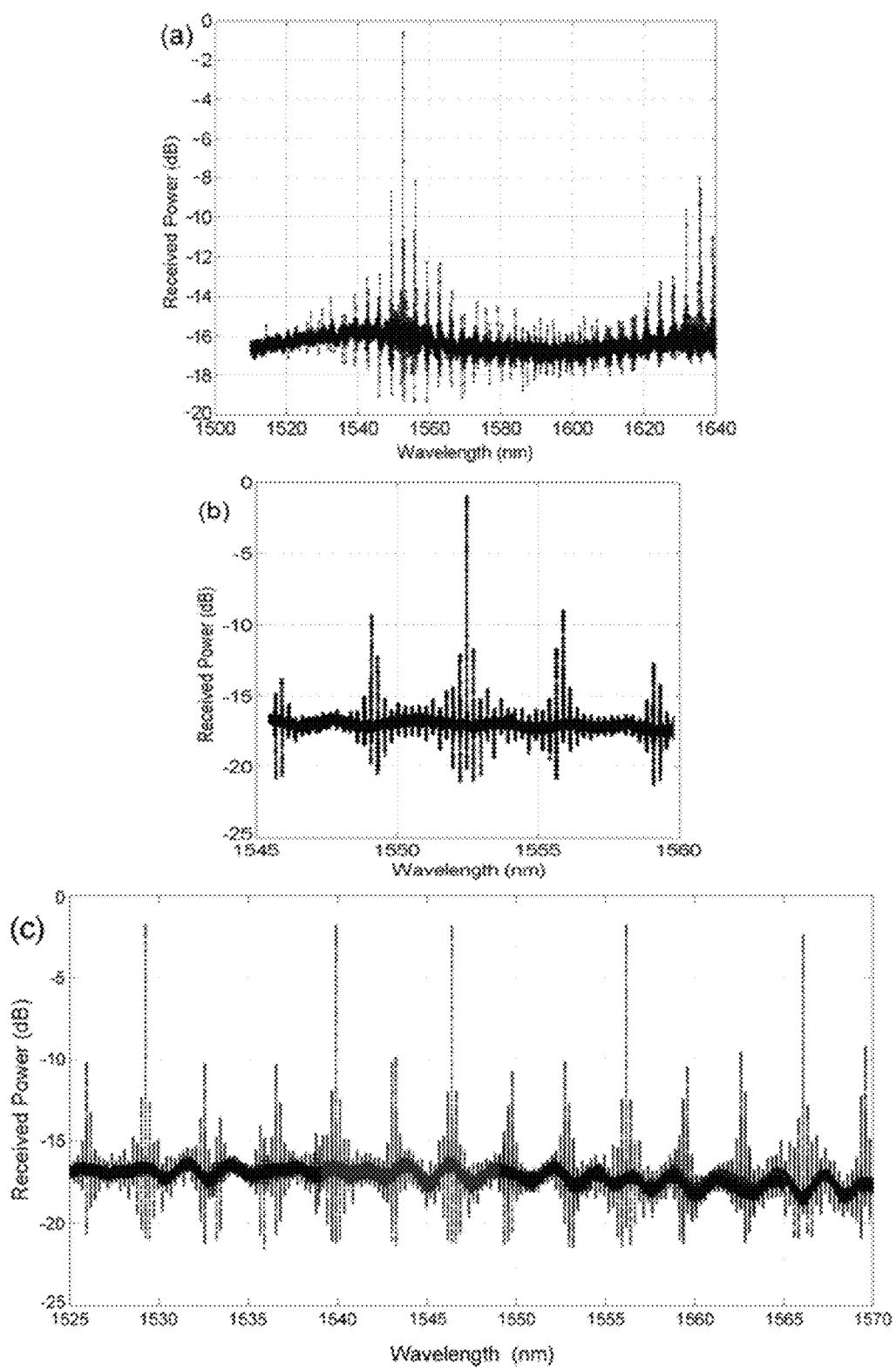
FIG. 6 Measured reflection spectra of a fabricated ultra-low loss 3 ring reflector device; (a) shows the broad spectrum, (b) shows a closer look at the central and close in reflection peaks, and (c) shows the tunability of the reflector—with multiple reflection spectra superimposed upon each other showing tunability across the full C-Band (1530 nm to 1565 nm).

Experimental measurements of the first fabricated ultra-low loss reflectors are shown in FIG. 6; these devices were based on the design used for the modeled results in FIG. 5. The reflection spectra for a 3 ring reflector show the suppression of additional potential lasing modes over an extended wavelength range (>120 nm) in FIG. 6(a), with a plot over a more narrow wavelength range in FIG. 6(b) showing the expected close in reflection peak structure. FIG. 6(c) shows a superposition of multiple measurements of reflection spectra taken with the reflector tuned to different wavelengths—showing tunability beyond the C-Band (1530 nm to 1565 nm) wavelength range. The measurement spectra in FIG. 6 confirm the operation of the 3 ring reflector design described in this invention.

Figure 7:
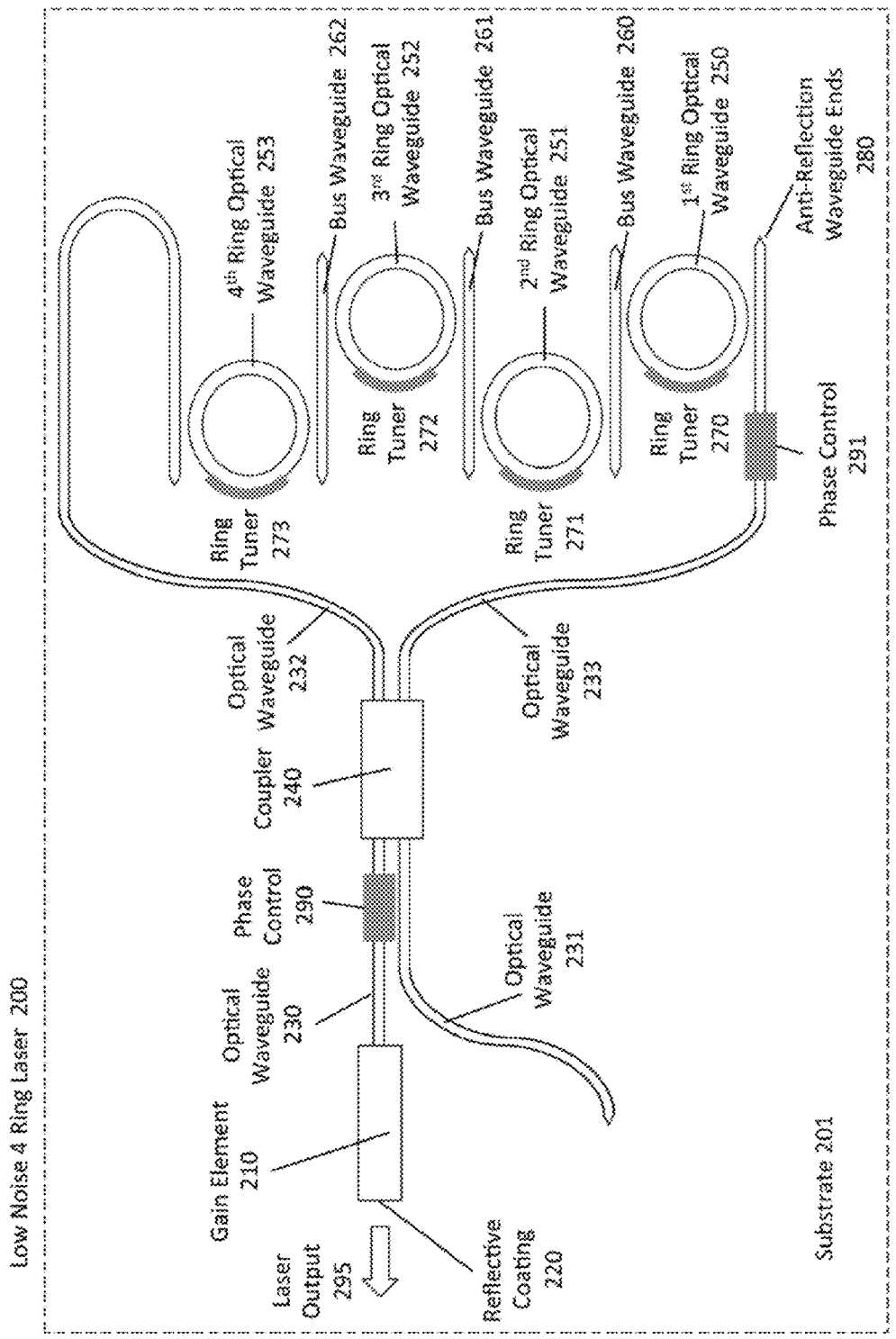
FIG. 7 Schematic of the 4 ring linear cavity laser design.

As the chosen microresonator radius is increased further in order to lower the loss, the selectivity of the filter structure becomes insufficient to choose only one lasing mode within the broad bandwidth of the gain element (also allowing for the laser to be tunable), even when using 3 microresonators with different and optimized radii, in which case the filter structure can be increased to include 4 microresonators—and the different radii of the 4 microresonators then optimized using the 'modified Vernier' effect, to provide the overall required filter function; feedback at only one wavelength over a wide wavelength range (e.g. >130 nm), high suppression of all other potential lasing modes (e.g. >15 dB), narrow bandwidth and long effective cavity length for very narrow linewidth operation (e.g. GHz or sub-GHz bandwidth, multiple cm cavity length) and low total filter loss (e.g. <2 dB). A schematic of one embodiment of a 4 ring based low noise laser source 200 is shown in FIG. 7, integrated on substrate 201 to provide high phase stability of the optical components making up the laser, or in some cases integrating the reflector on a substrate for high phase stability, however, utilizing a separate gain chip. An optical signal 295 at a single wavelength is created through the combination of the gain element 210 and the mode selection achieved in the laser cavity. The laser cavity is comprised of the broadband reflective coating 220 at one end of the gain element that is chosen to be less than 100% reflective in order to provide the laser output signal 295, plus the Sagnac Loop reflector that creates the other end of the linear laser cavity, the Sagnac loop reflector being comprised of 4 ring optical waveguides (250, 251, 252 and 253) with different ring radii (and therefore different FSR) interconnected with bus waveguides 260, 261 and 262—the loop reflector providing a long effective cavity length plus the required mode selectivity. The gain element 210 is connected to the optical waveguide of the laser cavity 230 either directly for a monolithic (e.g. silicon photonics based) device, or through hybrid integration (e.g. with a lens) for a hybrid integrated laser. The Sagnac loop comprises a coupler 240, either a 2×2 directional coupler as shown in FIG. 7, or alternative coupler designs. In the preferred embodiment, a 50%/50% coupler is used to split the optical power coming from the gain element into the two optical waveguides 232 and 233, which pass through a phase control element 291 and the 4 ring optical waveguides 250, 251, 252 and 253, before being re-combined at the coupler to complete the Sagnac loop and provide a wavelength selective reflector for the laser cavity with all of the energy reflected back to the gain element. If a different splitting ratio is achieved, either by design or by utilizing a tunable coupler for 240, an output can be taken from the $4^{th}$ waveguide of the coupler, i.e. the optical waveguide 231. Anti-reflection waveguide ends 280 (e.g. waveguides tapered down to a zero width over a long length) are added to the ends of all unused optical waveguides to avoid optical reflections at those waveguide ends from degrading the reflection response of the Sagnac loop based wavelength selective optical reflector. The resonance frequencies of each of the 4 ring optical waveguides 250, 251, 252 and 253, can be independently tuned using ring tuners 270, 271, 272 and 273 respectively. The phase control element 290 controls the laser cavity phase in order to control the exact wavelength of the lasing mode relative to the reflector peak wavelength. The Sagnac loop reflector phase control 291, together with the resonance frequency ring tuners of the 4 rings 270, 271, 272 and 273 are used to control the peak reflection wavelength of the Sagnac loop based reflector. The wavelength of the laser is chosen by aligning all of the ring optical wavelengths near the desired optical wavelength, then aligning the reflector phase and cavity phase to place the optical cavity mode at the desired wavelength relative to the reflector peaks.

Figure 8:
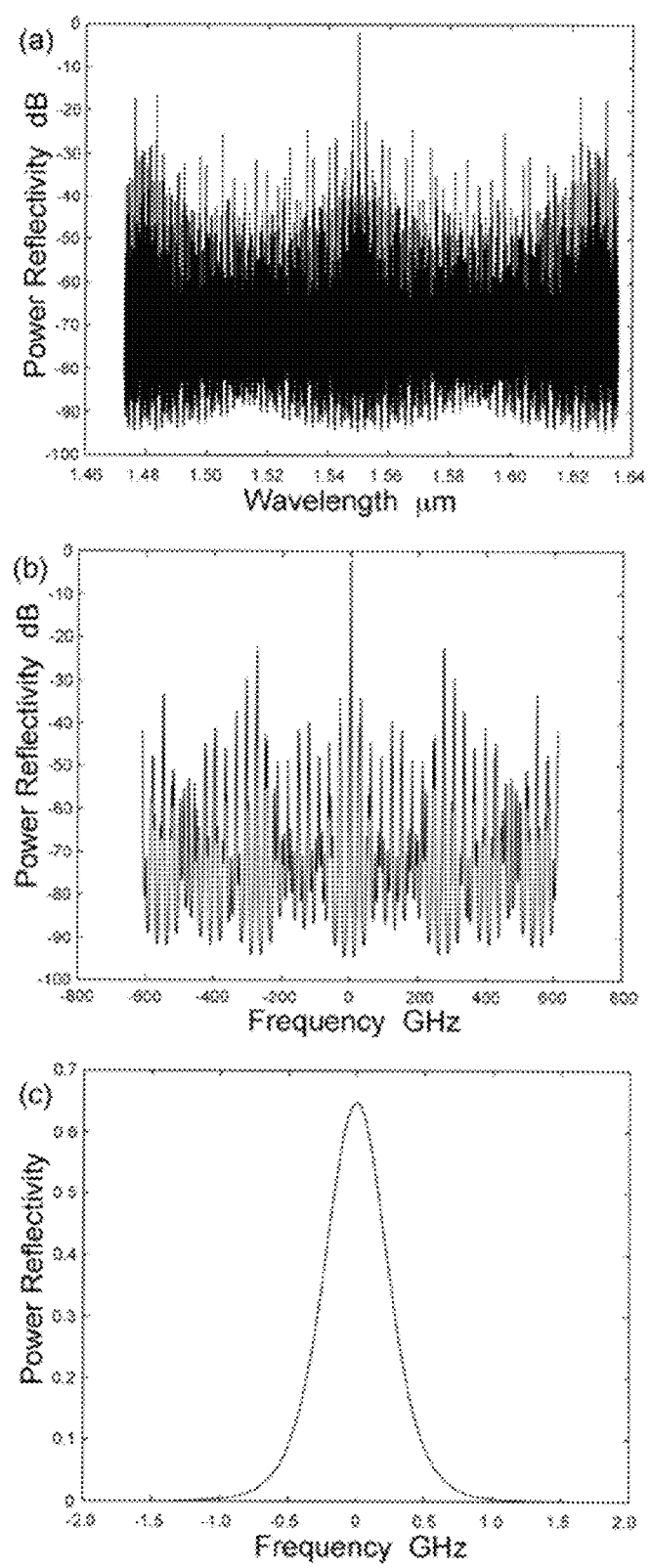
FIG. 8 Calculated power reflection spectra for a 4 ring laser reflector using ultra-low loss $Si_3N_4$ waveguides and ring radii of 1.0 mm, 1.00332 mm, 1.09829 mm and 1.22503 mm (Ring radii resonance frequencies chosen to align near 1550 nm); (a) shows the broad spectrum, (b) shows a closer look at the central and close in reflection peaks, and (c) shows a zoom in view of the central reflection peak.

An example of the reflection spectra from a 4 ring based reflector, with ring radii close to 1 mm radius (1 mm, 1.00332 mm, 1.09829 and 1.22503 mm) is shown in FIG. 8; here the $4^{th}$ microresonator is used to allow high mode suppression, >20 dB over a wide wavelength range, while providing a wider bandwidth (0.9 GHz), lower effective cavity length (47 mm), however, also higher peak reflectivity. The $4^{th}$ microresonator therefore can provide additional freedom in the optimization of different laser reflector parameters, depending on the chosen laser application and required performance. The number of rings utilized in a reflector/filter, N, can be increased from 4 rings, to 5, 6 or more rings as required to optimize the laser performance for a specific application, the higher number of rings providing further degrees of freedom in optimizing the reflector/filter performance. All N rings in such a reflector/filter will be coupled to intermediate busses, as in the 3 and 4 ring designs shown in FIGS. 3 and 7, the overall response being optimized by the choice of ring circumferences and coupling coefficients.

While a general design will utilize rings of different circumferences, all with different resonant frequencies except for a common resonance frequency at which the laser will operate, in some cases it may be desirable to have multiple rings with the same resonance frequency; e.g. rather than having a single ring with narrower bandwidth and longer delay, two rings, both with a broader bandwidth and half the peak delay response could be utilized—providing the same response with the combination of two rings, however, with a higher power handling capability than the single ring. In some designs more than 2 rings of the same circumference may be utilized to further improve the power handling capability.

The total number of rings, N, each with a different radius and therefore different FSR, can be increased as necessary to provide the required filter function, as well as each microresonator radii optimized. The microresonators can be ring shaped, racetrack shaped, or any arbitrary shape that has the same overall effect of a looped waveguide. The downside to increasing the number of microresonators too far is the need to tune the resonance frequency of each microresonator to obtain the correct filter function, which becomes more difficult as the number of microresonators increases. Additionally, the design process for a higher number of microresonators can become more difficult—however, this design process can be optimized numerically.

Figure 9:
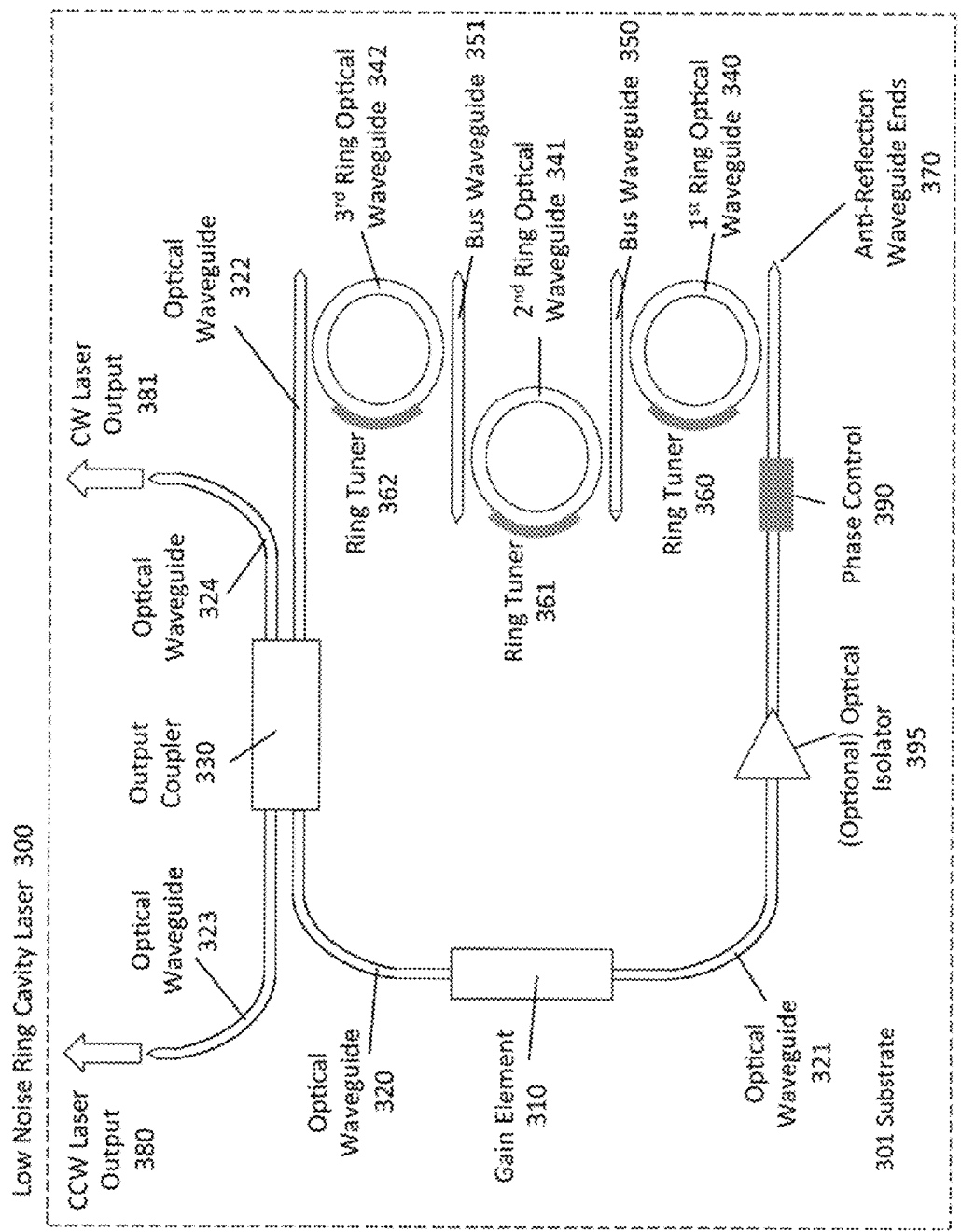
FIG. 9 Schematic of a ring laser cavity utilizing 3 rings in the filter design.

A ring laser structure is good for low noise laser designs because it does not include any laser facets (cavity end reflections), so that for unidirectional oscillation the ring eliminates standing waves and therefore spatial hole-burning effects. Additionally, the ring design is far less susceptible to residual optical reflections within the laser cavity that would provide parasitic Fabry-Perot modes with the large facet reflections in a linear laser design. Using a monolithic integrated or heterogeneously integrated approach, where the gain element is fabricated along with the waveguides and microresonators, a ring laser can be more easily fabricated utilizing the microresonator based filters described previously for the linear cavity, but with the filters used in pass through mode rather than as a reflector. A schematic for one embodiment of an ultra low noise ring laser 300 is shown in FIG. 9, which utilizes similar components to the 3 ring laser in FIG. 3, however, arranged in a ring cavity rather than a linear cavity. The ring laser is integrated on substrate 301 to provide high phase stability of the optical components making up the laser. The gain element 310 is part of the ring cavity together with a 3 ring wavelength selective filter for mode selectivity and to extend the cavity length, plus a phase control element 390 to control the lasing mode, and a coupler 330 to couple part of the optical signal out of the ring cavity. The gain element 310 is coupled to waveguide 321, through an optional optical isolator 395, through a phase control element 390, then through the 3 rings of the filter 340, 341 and 342, using interconnecting bus waveguides 350 and 351, into the optical waveguide 322 and through the output coupler 330, before completing the ring with optical waveguide 320 into the other end of the gain element 310. The resonance frequencies of the 3 ring optical waveguides are controlled by the 3 ring tuners 360, 361 and 362. Anti-reflection waveguide ends 370 (e.g. waveguides tapered down to a zero width over a long length) are added to the ends of all unused optical waveguides to avoid optical reflections at those waveguide ends from degrading the response of the wavelength selective optical filter. The ring laser operating without an optical isolator will have two counter-propagating optical signals, which are coupled out of the ring cavity by the coupler 330, through the 2 optical waveguides 323 and 324, to provide the Counter-Clockwise (CCW) Laser Output 380 and the Clockwise (CW) Laser Output 381.

One option for a ring laser, as shown in FIG. 9, includes an isolator 395 within the ring to ensure single direction lasing; appropriate isolators integrated with silicon photonics waveguides and microresonators have been demonstrated, such as described in "The on-chip integration of magnetooptic waveguide isolators" by M. Levy, IEEE JOURNAL of SELECTED TOPICS in QUANTUM ELECTRONICS, 8, pages 1300 to 1306, 2002. The ring laser can be designed using ultra-low loss waveguides to create devices with 3 microresonators, 4 microresonators, or more microresonators, as required to obtain the required mode selectivity and laser performance.

Without an isolator within the ring cavity, the device will tend to operate with two lasing modes, one in each ring direction, due to the symmetry of the device. This dual output (in opposite ring direction) operation is very useful in certain applications, in particular for fabricating a ring laser based gyroscope. Using this approach it will be possible to integrate the entire ring laser based gyroscope device, including combining the two outputs in an integrated detector to create the beat frequency (related to the rotation of the device), in a single Photonic Integrated Circuit (PIC) device. Using ultra-low loss integrated waveguides, the ring structure can be extended through many spirals of the waveguide to increase the gyroscope sensitivity.

Figure 10:
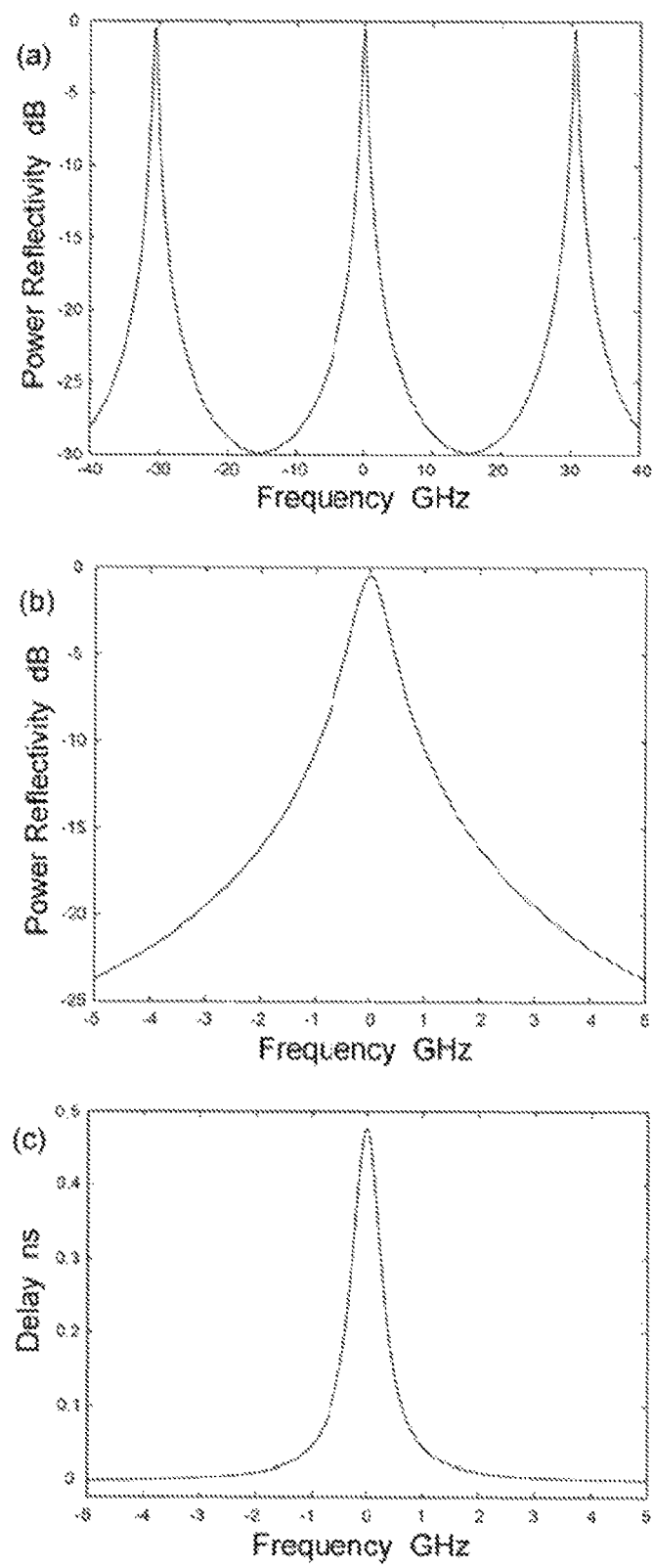
FIG. 10 Calculated power reflection spectra for a single ring laser reflector using ultra-low loss $Si_3N_4$ waveguides and a ring radius of 1.0 mm (central ring resonance wavelength near 1550 nm); (a) Shows a broader spectrum with multiple reflection peaks separated by the ring FSR, (b) shows a closer look at the central reflection peak, and (c) shows the delay versus frequency of the central reflection peak.
Figure 11:
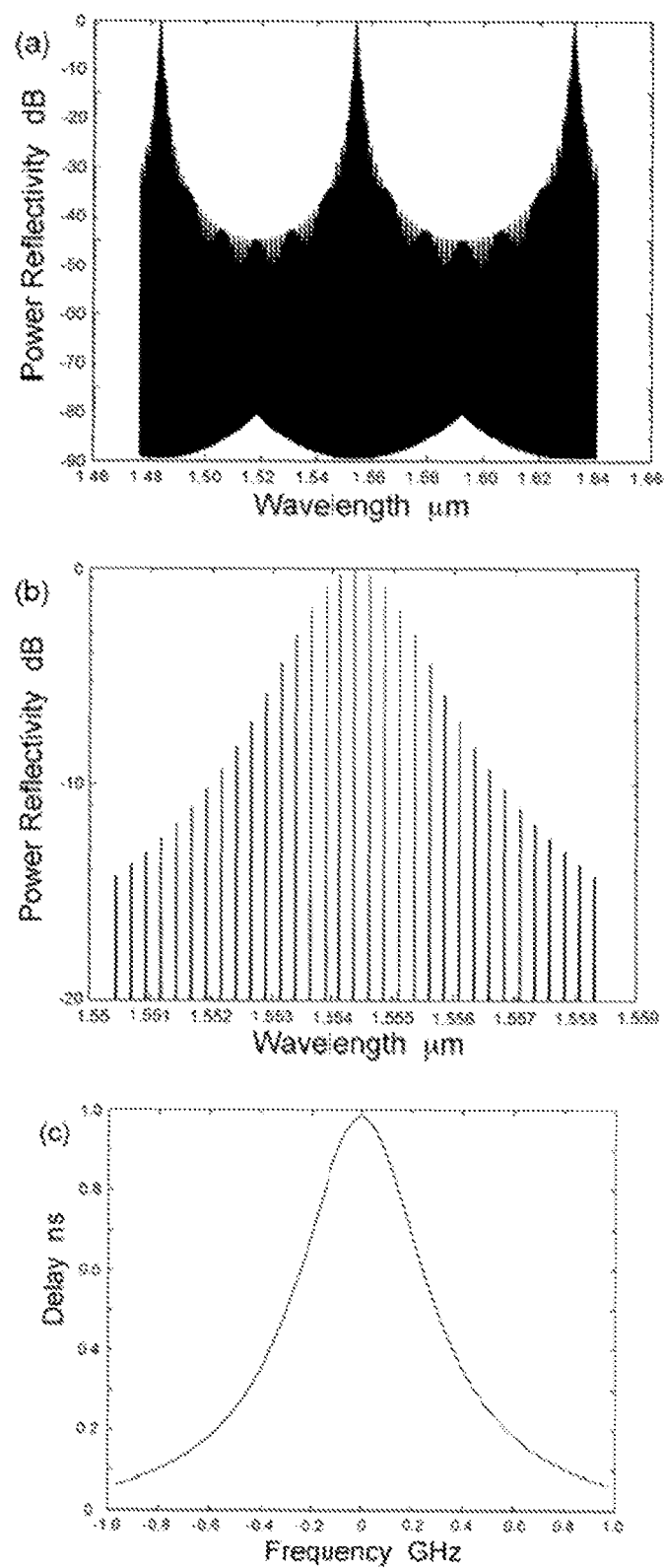
FIG. 11 Calculated power reflection spectra for a 2 ring laser reflector using ultra-low loss $Si_3N_4$ waveguides and ring radii of 1.0 mm and 1.00332 mm (Ring radii resonance frequencies chosen to align near 1550 nm); (a) Shows the broad spectrum, (b) shows a closer look at the central and close in reflection peaks, and (c) shows a zoom in view of the central reflection peak; showing the delay versus frequency.

Optimization of the ring radii and coupling coefficients in the linear cavity or ring cavity lasers can initially be carried out using a computer simulation of the reflector response, together with a manual method to choose appropriate ring values. Due to the complexities of this design process, initial designs can be made using the same coupling coefficient for each ring, e.g. $\kappa=0.25$. An example design process starts with a minimum ring radius, e.g. 1 mm, for the first ring size, and then finds the appropriate values for the following ring radii to meet overall reflector requirements. The reflection characteristics of an initial single ring reflector, using a minimum ring size of 1 mm in order to ensure lowest waveguide loss, are shown in FIG. 10. The FSR of a single ring is small, in this case ~30 GHz, as shown in FIG. 10(a). The reflectivity of the central reflection near 1550 nm is shown in FIG. 10(b), while the delay of this reflector near 1550 nm is shown in FIG. 10(c). The fact that many closely spaced reflection peaks have the same peak reflectivity mean that this reflector if used in a laser cavity would provide multimode lasing output.

Figure 12:
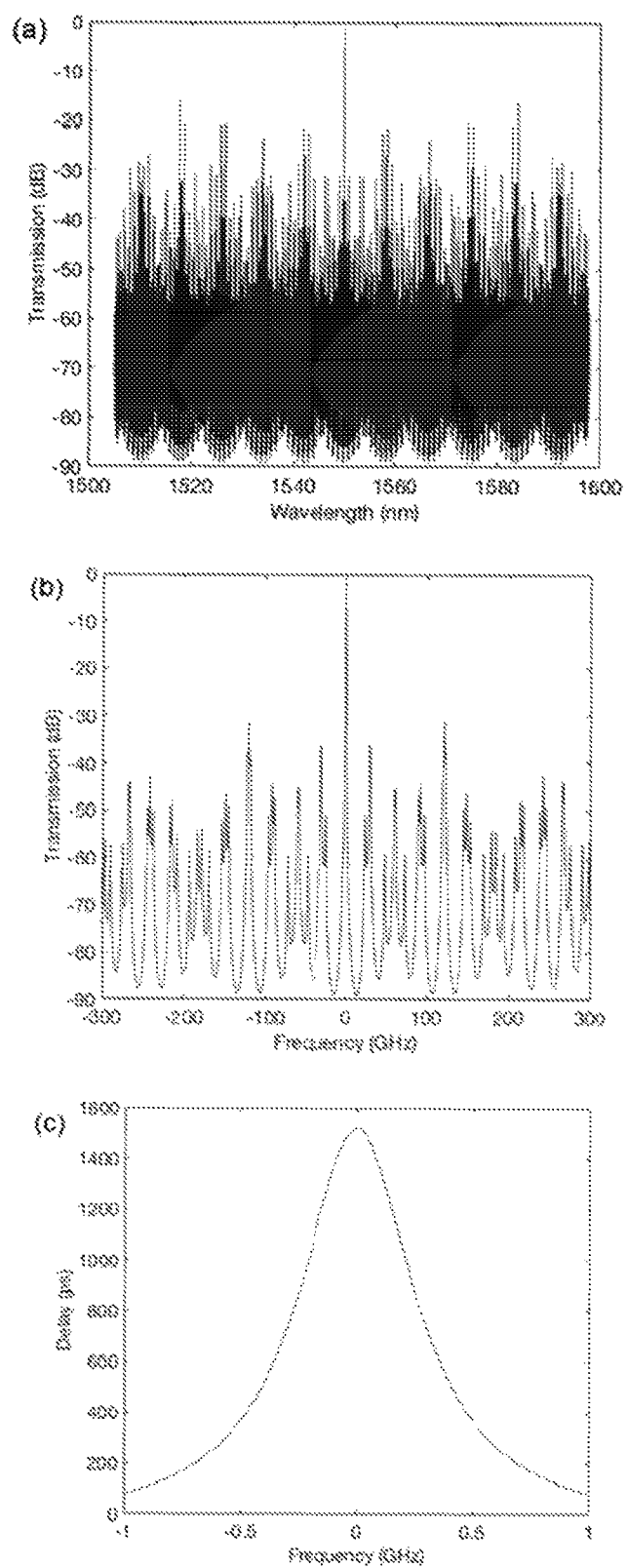
FIG. 12 Calculated power reflection spectra for a 3 ring laser reflector using ultra-low loss $Si_3N_4$ waveguides, with example ring radii found using computer optimization to be 1.0 mm, 1.03 mm, and 1.267 mm (Ring radii resonance frequencies chosen to align near 1550 nm); (a) shows the broad spectrum, (b) shows a closer look at the central and close in reflection peaks, and (c) shows a zoom in view of the central reflection peak.

In order to provide only one reflection peak within the large bandwidth of the gain medium used in a laser, e.g. 60 nm, a second ring is added which has a ring radius very close to that of the first ring. The smaller the % difference in ring radii between the first two rings, the further away in wavelength the next reflection peaks are (one on the short wavelength side and one on the long wavelength side). This large wavelength separation, which can also be called the superstructure period, is made sufficiently large by having the two rings very close in radii, such as 1 mm and 1.00332 mm as shown in FIG. 12. The large wavelength separation of this dual ring reflector is ~70 nm on the short wavelength side and ~80 nm on the long wavelength side, as shown in FIG. 12(a). While the main reflection peaks are widely separated, looking close in around the main reflection peak, in this case near 1554 nm, as shown in FIG. 12(b), it can be seen that there are many close in reflection peaks that, although not having as high a reflectivity as the central peak, have reflections that are of similar size, and therefore in a laser cavity could potentially give rise to multimode operation. The difference in reflectivity provides the selectivity of the central mode over other close-in reflections. The final plot, FIG. 12(c), shows the delay spectrum of the central reflection peak only.

The final ring radius in a 3 microresonator laser reflector can be found by using the 2 ring radii found to provide the required superstructure period, and then varying the value of the third ring radius and looking for the optimum reflector characteristics. One approach is to calculate key reflector characteristics, such as the height of the second highest reflection peak within a required bandwidth, e.g. +/−45 nm; which would support a laser tunable from 1550 nm+/−20 nm, with 5 nm guard-bands on each side, and then optimize the third ring radius to minimize the second highest reflection peak within that bandwidth. A further refinement would be to also look over a smaller wavelength range, close to the central peak, e.g. +/−100 GHz, in which range a second reflection peak will have more of an effect on the laser performance, e.g. laser noise within a system's bandwidth or more likely to destabilize the laser performance, and optimize to provide a higher suppression of reflection peaks within this narrow range than across the wide wavelength range. The optimization process should also consider the sensitivity of these two parameters to small variations of ring radii around the designed values, in order to take account of fabrication variations. Such an optimization, either run manually by calculating the suppression of the next highest reflections across the wide and narrow range for different third ring radius, or by running the computer simulation with the third ring radius as the variable, will produce an optimized three ring laser reflector design such as shown in FIG. 5 (radii of 1.0 mm, 1.00332 mm, and 1.07443 mm).

Figure 13:
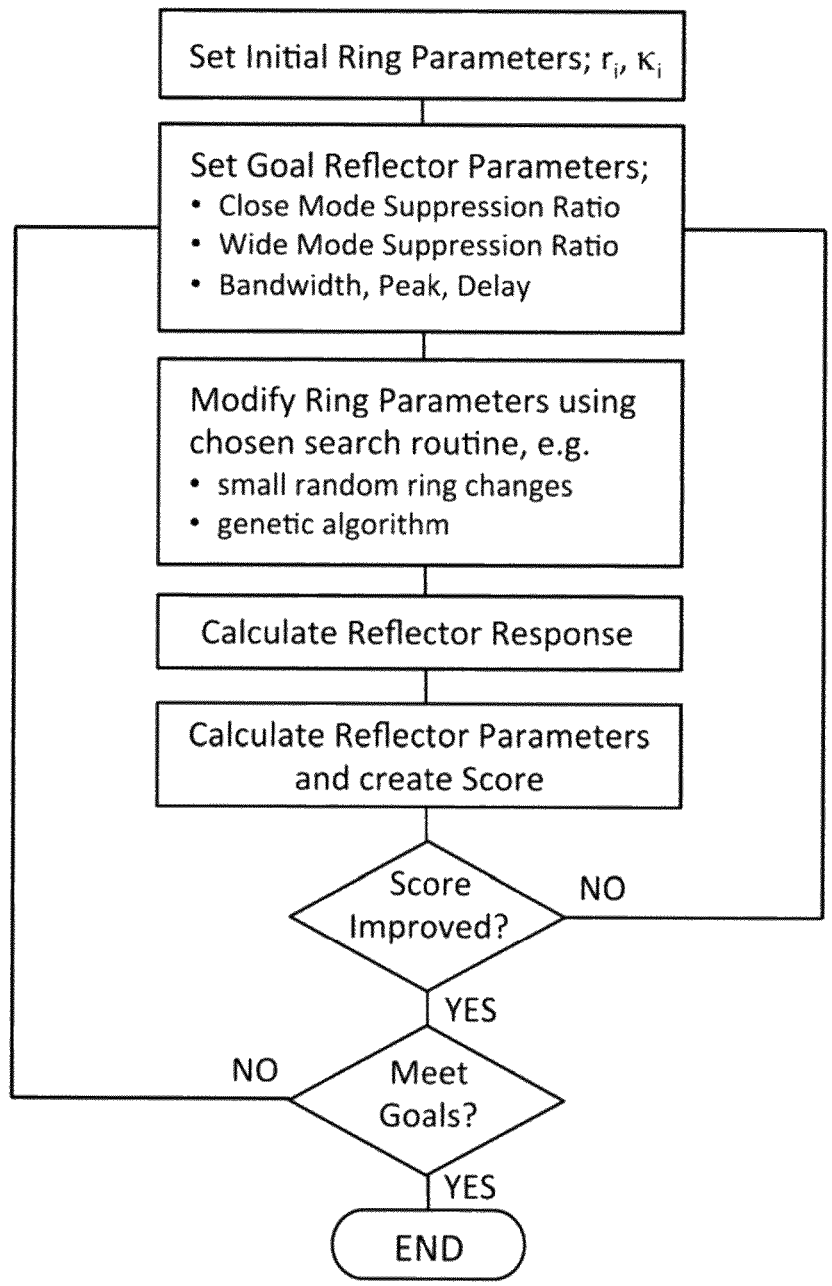
FIG. 13 Algorithm for computer optimization of laser ring radii and coupling coefficients to provide required laser reflector performance.

A further design optimization can be made by designing the laser reflector/filter simulation to automatically optimize the ring radii, and potentially also the coupling coefficients of each ring, using an algorithm to measure the performance of each reflector and then varying ring parameters until the optimum (or required) reflector performance is obtained. The overall performance can include parameters such as the suppression of additional reflections over both a wide and a narrow wavelength range, as well as calculating key parameters of the central reflection peak such as its peak reflectivity, peak delay (or effective length) and bandwidth. The computer algorithm can then choose the optimum ring radii (and coupling coefficients) through either randomly varying the parameters and finding the optimum reflector performance, or through the use of other approaches to find optimum values such as more defined search algorithms, e.g. starting with suggested ring radii and coupling coefficients, varying these values a small amount and only accepting changes when improvements in performance are found. This kind of search algorithm can also be paired with a random element, in order to avoid any local optimum in ring parameters that are not the global optimum design. An example of an algorithm to optimize the ring parameters is shown in FIG. 13. Such an algorithm can be used for 3, 4, 5 or more ring based reflector designs. The higher the number of rings, the more the reflector design can be optimized for a specific laser cavity, or laser application design.

The microresonator rings can be of any shape that forms a loop, including circle, oval, racetrack, rectangular etc.

The rings in the laser designs, as well as the phase control elements (see FIGS. 3, 7, and 9) are each tuned to control either the resonance frequency of the ring, or the reflector or cavity phase with the phase control elements. Tuning can be accomplished by a number of mechanisms, e.g. thermal tuning of the waveguide index by placing a heater near to the waveguide structure of the relevant component (microresonator or waveguide), or electro-stress tuning of the waveguide index using Lead Zirconate Titanate (PZT) or other transducers, Liquid Crystal based waveguide index tuning, Micro-Electro-Mechanical System (MEMS) based physical tuning of the waveguide geometry, or other relevant mechanisms to tune the resonance frequency of the microresonator and optical phase of the phase control sections. Additionally, when necessary, the coupling coefficients between rings and their associated busses can be adjusted/tuned in order to optimize the laser performance for a specific application; this can be achieved by e.g. thermal tuning of the coupling region, or by utilizing a more complex tunable coupling coefficient design for larger tunability, e.g. a Mach-Zehnder Interferometer with a tunable arm.

The description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A source of coherent radiation, comprising:
an optical resonant cavity having a gain element with one partially reflecting mirror for reflecting a part of radiation back inside the cavity and partially outputting a laser emission; a directional coupler, the coupler splitting incoming radiation into clockwise and counterclockwise beams: both beams passing through a Sagnac loop: the loop incorporating at least a first, a second and a third microresonator rings interconnected via intermediate bus waveguides so that none of the rings directly couples to one another: the first ring, the second ring and the third ring having different sets of resonant frequencies; and wherein one resonant frequency is common for all three rings and there is no other common resonant frequency over a wavelength range of at least 40 nm; the first ring, the second ring and the third ring circumferences optimized for required laser performance; the clockwise and counterclockwise beams recombine coherently in the directional coupler: the coupler outputs an obtained combined beam into the gain element: the gain element outputting the laser emission that has a linewidth less than 10 kHz, wherein the linewidth is determined by optimized selection of all ring circumferences and coupling coefficients between all rings and all busses.

2. The source of claim 1, further comprising a phase control in the Sagnac loop providing a single mode operation of the source.

3. The source of claim 1, wherein each ring has its ring tuner for tuning sets of resonant frequencies of each ring.

4. The source of claim 1, wherein having N rings (N>3) connected via additional intermediate bus waveguides and with an in-between bus waveguides to the third ring, each N-th additional ring having a set of resonant frequencies being different from each set of resonant frequencies for each of N−1 rings, and the additional N-th ring having one resonant frequency common with each of N−1 rings over a wavelength range of at least 40 nm.

5. The source of claim 1, wherein the Sagnac loop is integrated on a substrate providing phase stability of the Sagnac loop better than $\pi/100$.

6. The source of claim 1, wherein at least one replacing ring from the first, the second and the third rings, with a chosen resonance frequency and a chosen bandwidth is replaced by at least two rings, replacement rings, all with the same resonance frequency but with bandwidths larger than the chosen one so that a combined bandwidth of the at least two replacement rings equals the chosen bandwidth of the replacing ring, where the replacement rings are interconnected via intermediate bus waveguides so that none of the rings directly couples to one another.

7. A method to produce a laser emission, comprising:
generating spontaneous radiation in a gain element in a cavity: wherein the cavity incorporating a Sagnac loop; splitting incoming radiation via a directional coupler into clockwise and counterclockwise beams: passing the beams through the Sagnac loop; filtering the radiation by passing it through at least three rings, having different circumferences, connected via intermediate bus waveguides, so that none of the rings directly couples to one another; assuring that the rings have different sets of resonant frequencies wherein one resonant frequency is common for all rings, and there is no other common resonant frequency over a wavelength range of at least 40 nm; optimizing all ring circumferences and coupling coefficients between all rings and all busses to achieve an output emission linewidth less than 10 kHz: recombining the clockwise and counterclockwise beams coherently in the directional coupler; outputting an obtained combined beam into the gain element via the coupler: and partially reflecting the radiation from at least one reflecting surface back to the cavity and partially outputting the laser emission with the linewidth less than 10 kHz.

8. The method of claim 7, further optimizing all ring circumferences by tuners and adjustment of the coupling coefficients to achieve the output emission linewidth less than 10 kHz.

9. The method of claim 7, further optimizing all ring circumferences and adjustment of the coupling coefficients to achieve a given wavelength of the laser emission with the linewidth less than 10 kHz.

10. The method of claim 7, wherein at least one replacing ring from the first, the second and the third rings, with a chosen resonance frequency and a chosen bandwidth is replaced by at least two rings, replacement rings, all with the same resonance frequency but with bandwidths larger than the chosen one so that a combined bandwidth of the at least two replacement rings equals the chosen bandwidth of the replacing ring, where the replacement rings are interconnected via intermediate bus waveguides so that none of the rings directly couples to one another.

11. A source of coherent radiation, comprising:
an optical resonant cavity in a form of a ring laser cavity:
a gain element; a waveguide connecting the gain element with a first ring microresonator: the ring laser cavity incorporating at least the first, a second and a third ring microresonators interconnected via intermediate bus waveguides, so that none of the rings directly couples to one another, the first ring, the second ring and the third ring microresonators having different circumferences, with different sets of resonant frequencies: and wherein one resonant frequency is common for all ring microresonators and there is no other resonant frequency over a wavelength range of at least 40 nm; wherein the ring laser cavity incorporates a coupler: the coupler having four ports; the ring laser cavity being connected to the coupler through two ports; and the coupler forming a part of the ring laser cavity by letting a part of radiation going through the coupler directly back into the ring laser cavity without reflection; and two other ports serving to output a laser emission that has a linewidth less than 10 kHz, wherein the linewidth is determined by optimized selection of all ring circumferences and coupling coefficients between all rings and all busses.

12. The source of claim 11, further including a phase control providing a single mode operation of the source.

13. The source of claim 11, further comprising tuning characteristics by tuners at each ring to achieve the linewidth of the laser emission less than 10 kHz.

14. The source of claim 11, further comprising optimizing the first ring, the second ring and the third ring coupling coefficients to bus waveguides to achieve the linewidth of the laser emission less than 10 kHz.

15. The source of claim 11, further comprising an optical isolator in the ring laser cavity.

16. The source of claim 11, wherein the Sagnac loop is integrated on a substrate providing phase stability of the Sagnac loop better than $\pi/100$.

17. The source of claim 1, wherein having N rings (N>3) connected via additional intermediate bus waveguides and with an in-between bus waveguides to the third ring, each N-th additional ring having a set of resonant frequencies being different from each set of resonant frequencies for each of N−1 rings, and the additional N-th ring having one resonant frequency common with each of N−1 rings over a wavelength range of at least 40 nm.

18. A method to produce laser emission, comprising:
generating spontaneous radiation in a gain element in a ring cavity: filtering the radiation by passing it through at least three rings, having different circumference, connected via intermediate bus waveguides, so that none of the rings directly couples to one another, assuring that the rings have different sets of resonant frequencies wherein one resonant frequency is common for all rings, and there is no other resonant frequency over a wavelength range of at least 40 nm; optimizing all ring circumferences and coupling coefficients between all rings and all busses to achieve an output emission linewidth less than 10 kHz; partially outputting the laser emission with the linewidth less than 10 kHz; incorporating a coupler into the ring laser cavity: the coupler having four ports; the ring laser cavity being connected to the coupler through two ports; and the coupler forming a part of the ring, laser cavity by letting a part of radiation going through the coupler directly back into the ring laser cavity without reflection; and partially outputting the laser emission with the linewidth less than 10 kHz via two other ports of the coupler.

19. The method of claim 18, further optimizing all ring circumferences by tuners and adjustment of the coupling coefficients to achieve the output emission linewidth less than 10 kHz.

20. The method of claim 18, further optimizing all ring circumferences by tuners and adjustment of the coupling coefficients to achieve a given wavelength of the laser emission with the linewidth less than 10 kHz.

* * * * *